(12) United States Patent
Jo

(10) Patent No.: US 11,697,874 B2
(45) Date of Patent: Jul. 11, 2023

(54) TANTALUM CARBIDE COATED CARBON MATERIAL

(71) Applicant: TOKAI CARBON KOREA CO., LTD, Gyeonggi-do (KR)

(72) Inventor: Dong Wan Jo, Gyeonggi-do (KR)

(73) Assignee: TOKAI CARBON KOREA CO., LTD, Gyeonggi-do (KR)

( * ) Notice: Subject to any disclaimer, the term of this patent is extended or adjusted under 35 U.S.C. 154(b) by 0 days.

(21) Appl. No.: 17/539,448

(22) Filed: Dec. 1, 2021

(65) Prior Publication Data

US 2022/0170149 A1     Jun. 2, 2022

(30) Foreign Application Priority Data

Dec. 1, 2020  (KR) .......................... 10-2020-0166038

(51) Int. Cl.
*C23C 16/32* (2006.01)
*C30B 35/00* (2006.01)

(52) U.S. Cl.
CPC ............. *C23C 16/32* (2013.01); *C30B 35/00* (2013.01)

(58) Field of Classification Search
CPC ................................. C23C 16/32; B23C 5/16
USPC ........................................................ 428/698
See application file for complete search history.

(56) References Cited

U.S. PATENT DOCUMENTS

| 2005/0106384 | A1 | 5/2005 | Sambasivan et al. |
| 2012/0040172 | A1* | 2/2012 | Fujiwara ................ C04B 41/52 |
| | | | 427/372.2 |
| 2019/0169768 | A1 | 6/2019 | Mori et al. |
| 2020/0149157 | A1* | 5/2020 | Jo ........................... C04B 35/52 |
| 2020/0216319 | A1* | 7/2020 | Jo ........................... C01B 32/05 |

FOREIGN PATENT DOCUMENTS

| EP | 1852407 A1 | 11/2007 |
| EP | 3466874 A1 | 4/2019 |
| EP | 3617174 A1 | 3/2020 |
| JP | 2006348388 A | 12/2006 |
| JP | 2019099453 A | 6/2019 |
| JP | 2019108611 A | 7/2019 |
| WO | 2004009515 A1 | 1/2004 |

OTHER PUBLICATIONS

Kim et al., "Chemical Vapor Deposition of Tantalum Carbide from TaCl5—C3H6—Ar—H2 System", Journal of the Korean Ceramic Society 53(6):1597-603 (2016).
Lu et al., "Microstructures, Abrasion Resistance and Corrosion Resistance of Plasma -Sprayed TaC and NbC Coatings", Materials Protection 51(12):1-5 (2018). DOI:10.16577/j.cnki.42-1215/tb.2018.12.001.

* cited by examiner

*Primary Examiner* — Seth Dumbris
(74) *Attorney, Agent, or Firm* — KDW Firm PLLC

(57) ABSTRACT

The present invention relates to a tantalum carbide coated carbon material, and more particularly, to a tantalum carbide coated carbon material including a tantalum carbide film having a surface contact angle of 50° or more and low surface energy.

9 Claims, 9 Drawing Sheets

TANTALUM CARBIDE COATED CARBON MATERIAL

CROSS-REFERENCE TO RELATED APPLICATION

This application claims the benefit of Korean Patent Application No. 10-2020-0166038 filed on Dec. 1, 2020, in the Korean Intellectual Property Office, the entire disclosure of which is incorporated herein by reference for all purposes.

BACKGROUND

1. Field of the Invention

One or more example embodiments relates to a tantalum carbide coated carbon material.

2. Description of the Related Art

In recent years, component materials capable of accurate process control and minimizing processes such as cleaning in semiconductor processes have been required. That is, mainly, high-temperature growth equipment used for SiC/AlN epitaxy, SiC/AlN growth, or the like measures a temperature using a radiation thermometer and uses the surface of a component as a radiation thermometer target (measuring region), but when process materials or particles and the like are deposited on a target region, there is a problem that the temperature measurement is incorrect.

Further, when the process material is easily deposited on the component, frequent cleaning of the component is required, and the life of the component may be affected, and further, a yield reduction in a semiconductor device manufacturing process may be caused. Therefore, in the semiconductor process, component materials capable of improving the yield of the semiconductor device, preventing adsorption, deposition, etc., of foreign materials, particles, etc., on the surface of the component material, and controlling an accurate process control have been required.

According to such an industrial requirement, a susceptor component generally used in semiconductor manufacturing equipment has a problem in that when a carbon material that has been used in an existing semiconductor process is used as it is, the carbon material is etched by corrosive gas, and thus, components coated with SiC or TaC on the surface of a structure of the carbon material have been used.

SUMMARY

Example embodiments provide a tantalum carbide coated carbon material including a tantalum carbide surface layer capable of lowering an adsorption possibility of foreign materials and improving the life of components by controlling surface energy.

Example embodiments provide a component for a semiconductor process capable of an accurate process temperature control in a semiconductor process, that is, accurate temperature measurement of a radiation thermometer, and less adsorption, attachment, deposition, etc. of foreign materials by applying the tantalum carbide coated carbon material according to the present invention.

However, technical objects of the present invention are not limited to the aforementioned purpose and other objects which are not mentioned may be clearly understood to those skilled in the art from the following description.

According to an aspect, there is provided a tantalum carbide coated carbon material including a substrate; and a tantalum carbide film formed on the substrate, in which a surface contact angle of the tantalum carbide film is 50° or more.

According to an example embodiment, the surface contact angle of the tantalum carbide film may be 65° to 76°.

According to an example embodiment, the tantalum carbide film may be (111)-plane priority growth in X-ray diffraction analysis.

According to an example embodiment, the tantalum carbide film may include X-ray diffraction peaks of (111), (200), (220), (311) and (222) planes as a main peak and a diffraction intensity ratio by the following relation 1 may be 1.5 or more.

$$I(111)/I((200)+(220)+(311)+(222)). \qquad \text{[Equation 1]}$$

According to an example embodiment, the tantalum carbide film may include X-ray diffraction peaks of (111), (200), (220), (311) and (222) planes as a main peak and a diffraction intensity ratio by the following relation 1 may be 1.8 to 2.5.

$$I(111)/I((200)+(220)+(311)+(222)). \qquad \text{[Equation 1]}$$

According to an example embodiment, an atomic ratio of Ta to C in the tantalum carbide film may be 0.9 to 1.34.

According to an example embodiment, the tantalum carbide film may be formed by CVD.

According to an example embodiment, the tantalum carbide may be heat-treated at a temperature of 2000° C. or more for 1 hour to 20 hours.

According to an example embodiment, the tantalum carbide film may include 30 or less of wrinkled patterns per unit area ($\mu m^2$) of the surface of a crystal grain.

According to an example embodiment, the tantalum carbide film may have a thickness of 10 μm to 50 μm.

According to an example embodiment, a ratio of the thickness of the tantalum carbide film formed on one surface of the substrate to the thickness of the substrate may be 2000:1 or 100:1.

According to an example embodiment, the substrate may include graphite.

According to an example embodiment, the tantalum carbide coated carbon material may be a component of a device used for single crystal SiC/AlN epitaxy and SiC/AlN growth process equipment.

Additional aspects of example embodiments will be set forth in part in the description which follows and, in part, will be apparent from the description, or may be learned by practice of the disclosure.

According to example embodiments, it is possible to provide a tantalum carbide coated carbon material capable of not only less adsorption of other materials and improving the life of components by lowering surface energy, but also improving economics by simplifying a semiconductor manufacturing process.

BRIEF DESCRIPTION OF THE DRAWINGS

These and/or other aspects, features, and advantages of the invention will become apparent and more readily appreciated from the following description of example embodiments, taken in conjunction with the accompanying drawings of which:

FIG. 4 is a diagram illustrating a droplet contact angle experimental result as an image according to an example embodiment, in which

DETAILED DESCRIPTION

Figure 1:
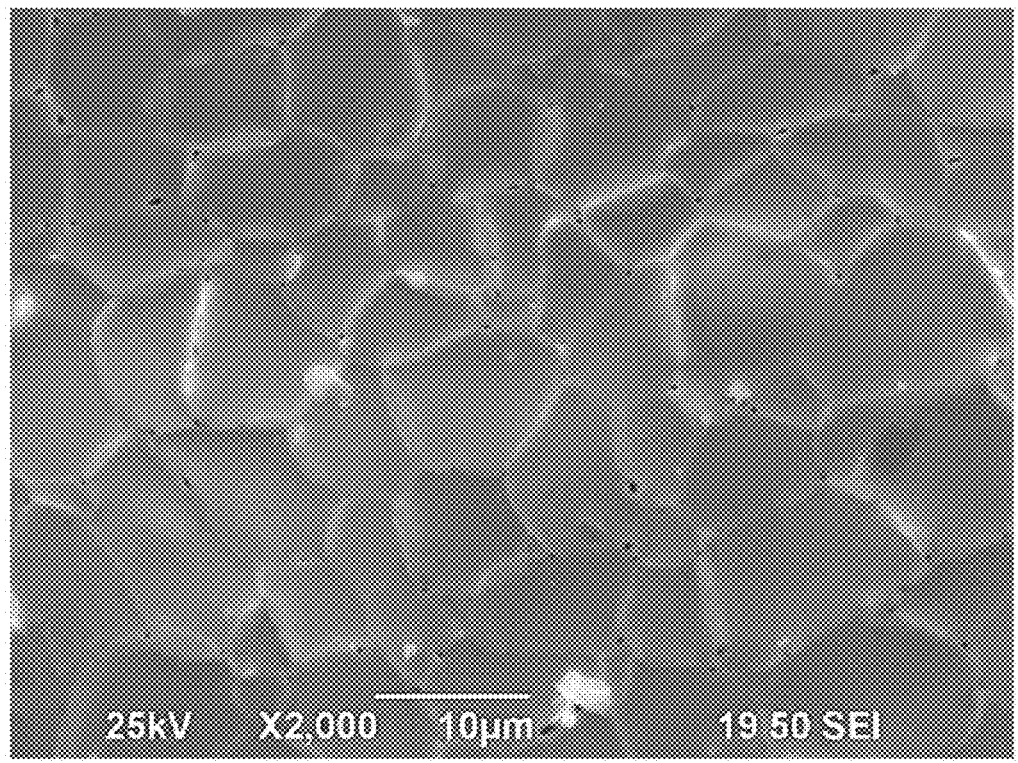
FIG. 1 is an SEM image illustrating a surface microstructure of a tantalum carbide coated carbon material of Example 1 according to an example embodiment.

Hereinafter, example embodiments of the present invention will be described in detail with reference to the accompanying drawings. In describing the example embodiment of the present disclosure, a detailed description of known functions or constitutions will be omitted if it is determined that they unnecessarily make the gist of the present disclosure unclear. Terminologies used herein are a terminologies used to properly express example embodiments of the present invention, which may vary according to a user, an operator's intention, or customs in the art to which the present invention pertains. Accordingly, definitions of the terminologies need to be described based on contents throughout this specification. Like reference numerals illustrated in the respective drawings designate like members.

Throughout this specification, it will be understood that when a member is referred to as being "on" another member, it may be directly on the other member or intervening members may also be present.

Throughout the specification, when a certain part "comprises" a certain component, it will be understood to imply the inclusion of stated elements but not the exclusion of any other elements.

Hereinafter, a tantalum carbide coated carbon material of the present invention will be described in detail with reference to example embodiments and drawings. However, the present invention is not limited to these example embodiments and drawings.

The present invention relates to a tantalum carbide coated carbon material, which may include a substrate; and a tantalum carbide film on at least one surface or the entire of the substrate according to an example embodiment of the present invention. The tantalum carbide film may lower the occurrence of adsorption, attachment, deposition, and the like of foreign materials on the surface through low surface energy, and may be useful for utilization as a component material in a semiconductor manufacturing process requiring hard process conditions and precise process control.

According to an example embodiment of the present invention, the tantalum carbide film may have a surface contact angle of 50° or more, or 60° to 80°. Preferably, the surface contact angle may be 65° to 76°. The surface contact angle means a droplet contact angle, which represents an angle that a liquid forms a thermodynamic equilibrium on the surface of a solid material and corresponds to a means for measuring the state of the surface energy. That is, the tantalum carbide film may mean that as the contact angle is increased, the surface energy of the material is lowered.

That is, the tantalum carbide coated carbon material may lower the adsorption possibility of the foreign materials by applying tantalum carbide with low surface energy, which may lower the number of times of cleaning process by the foreign material and the process material without preventing the operation of the thermometer by the foreign material adsorbed on the surface of a component material while measuring a process conduction such as a temperature in the semiconductor process when applied to the component material used in the semiconductor process. In addition, it is possible to prevent the lifetime of the components by the foreign material from being lowered.

According to an example embodiment of the present invention, the surface energy of the tantalum carbide film may be controlled by the shape, the crystal direction, etc. of crystal grains, and desired surface energy may be improved by adjusting at least one factor such as a priority growth crystal plane, a strength ratio of the crystal plane, and a ratio of components.

According to an example embodiment of the present invention, the tantalum carbide film may be (111)-plane priority growth in X-ray diffraction analysis, and the tantalum carbide film includes X-ray diffraction peaks of (111), (200), (220), (311) and (222) planes as main peaks and a diffraction intensity ratio by the following relation 1 may be 1.5 or more; 2 or more; and 3 or more. Preferably, the diffraction intensity ratio may be 1.8 or more to 2.5 or less. The XRD, i.e., the crystal property of the tantalum carbide film may be advantageous of lowering the contact angle of the surface of the tantalum carbide film.

$$I(111)/I((200)+(220)+(311)+(222)) \quad \text{[Equation 1]}$$

(I represents a diffraction intensity in XRD diffraction analysis.)

According to an example embodiment, the atomic ratio of Ta and C of the tantalum carbide film may be 0.9 to 1.34, and the atomic ratio may be adjusted to help to prevent wrinkled patterns from being formed on the surface of the tantalum carbide particle and lower the surface area to lower the surface energy.

According to an example embodiment, the tantalum carbide film may include wrinkled patterns of 30 or less; 20 or less; or 10 or less per unit area ($\mu m^2$) of the surface of the crystal grain. When there are 30 or less wrinkled patterns per unit area ($\mu m^2$), an increase in specific surface area by a curved portion may be lowered, and a soft and smooth surface may be formed to reduce the surface energy.

Figure 8:
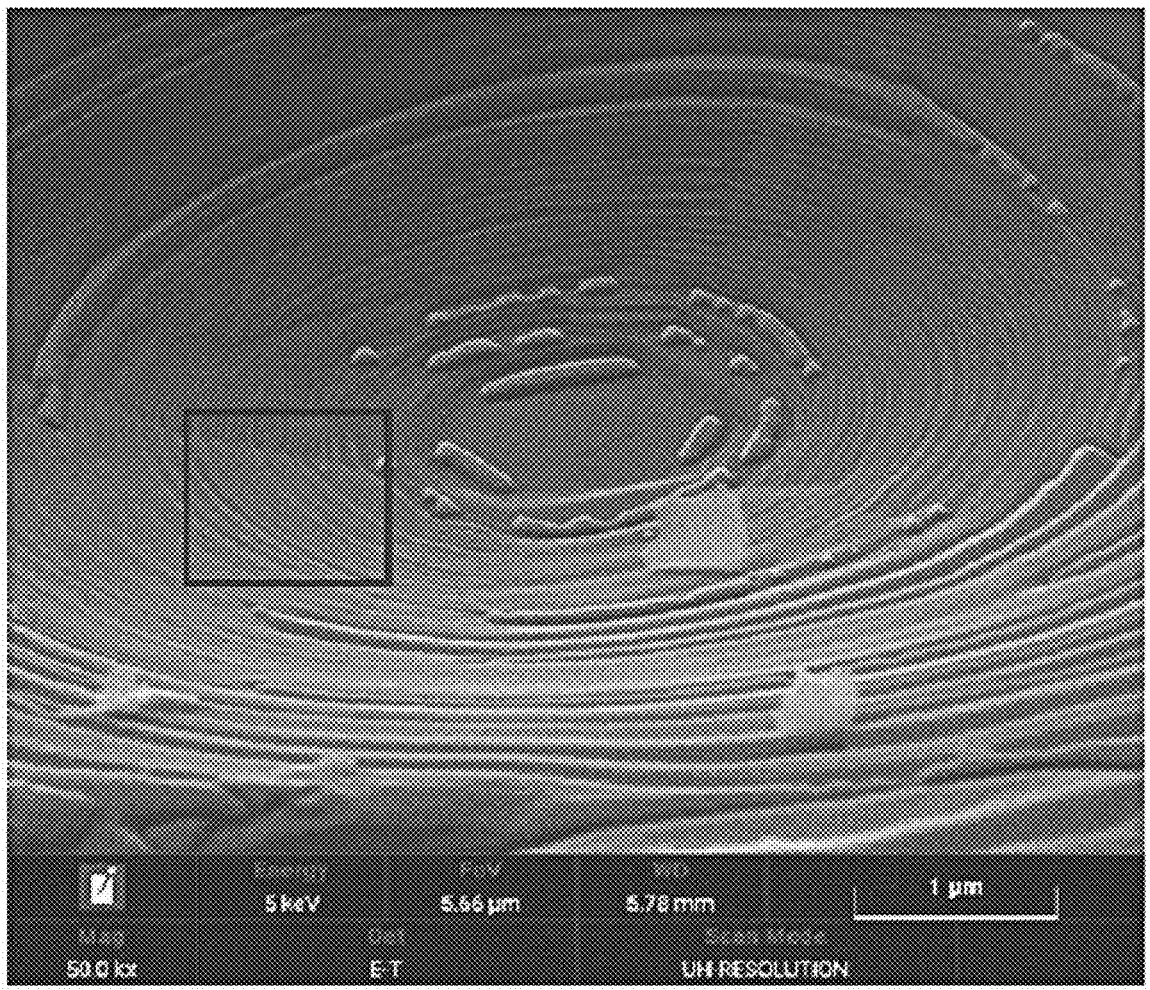
FIG. 8 is a diagram illustrating a method of measuring wrinkled patterns of a particle surface in a tantalum carbide film according to an example embodiment.

According to an example embodiment, the wrinkled patterns may be measured by a method of measuring an SEM image (model name: JEOL, JMS-7900) of a particle surface at 50,000× magnifications and counting the number of wrinkles per unit area ($\mu m^2$), as illustrated in FIG. 8.

According to an example embodiment, the thickness of the tantalum carbide film may be 10 μm to 50 μm. In addition, the tantalum carbide film may be heat-treated after synthesis and/or deposition, and for example, heat-treated at a temperature of 2000° C. to 2500° C. and an Ar atmosphere for 1 to 20 hours. The heat-treating process may help in surface energy control.

According to an example embodiment, the tantalum carbide film may have a thickness of 10 µm to 50 µm and a ratio of the thickness of the substrate and the thickness of the tantalum carbide film formed on one surface or the entire surface of the substrate may be 2000:1 to 100:1. When the tantalum carbide film is included in the range of the thickness and the thickness ratio, it is preferred to prevent outgassing and reduce stress between the substrate and tantalum carbide and minimize the deformation of the substrate after TaC deposition.

According to an example embodiment, the substrate may be appropriately selected according to a usage of the tantalum carbide coated carbon material, and for example, may be a carbon substrate, that is, include graphite.

The present invention relates to a component including the tantalum carbide coated carbon material of the present invention, and the component may be a component used for the semiconductor process. For example, the component may be components of single crystal SiC/AlN epitaxy and SiC/AlN growth process equipment.

The numerical ranges described in the present invention may be represented by or less, or more, less than and/or more than for a specific value in the range without departing from the object and the scope of the present invention.

EXAMPLES 1 TO 3

TaC was deposited on a graphite substrate by CVD vapor deposition.

COMPARATIVE EXAMPLES 1 TO 4

TaC was deposited on a graphite substrate by CVD vapor deposition.

Property Analysis (1) Analysis of Surface Microstructure

Figure 2:
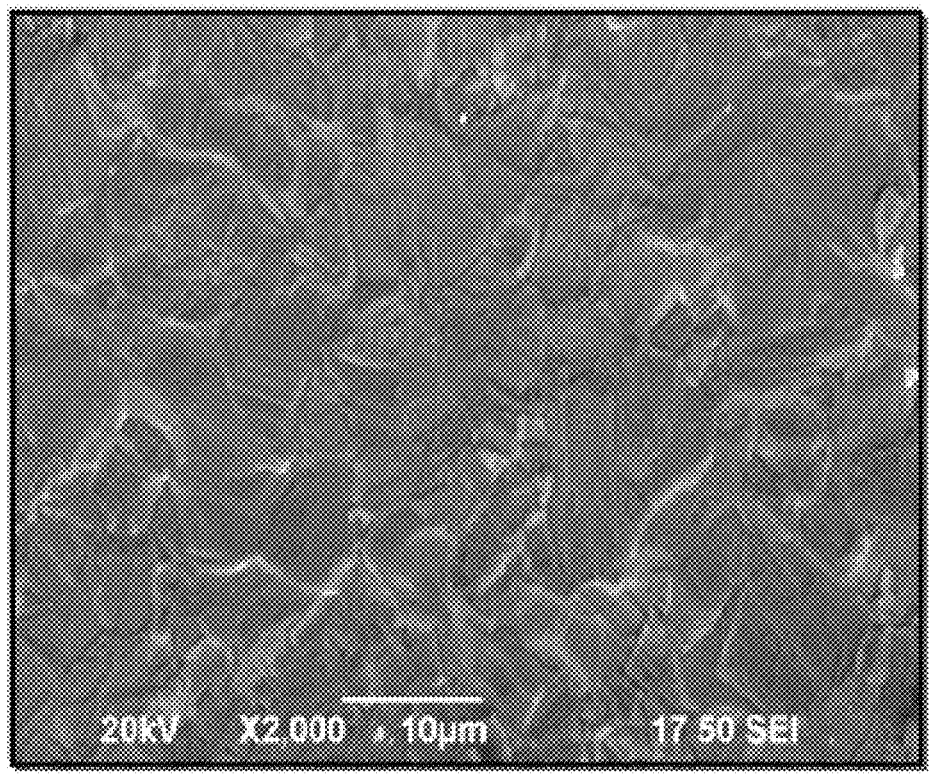
FIG. 2 is an SEM image illustrating a surface microstructure of a tantalum carbide coated carbon material of Comparative Example 1 according to an example embodiment.
Figure 3:
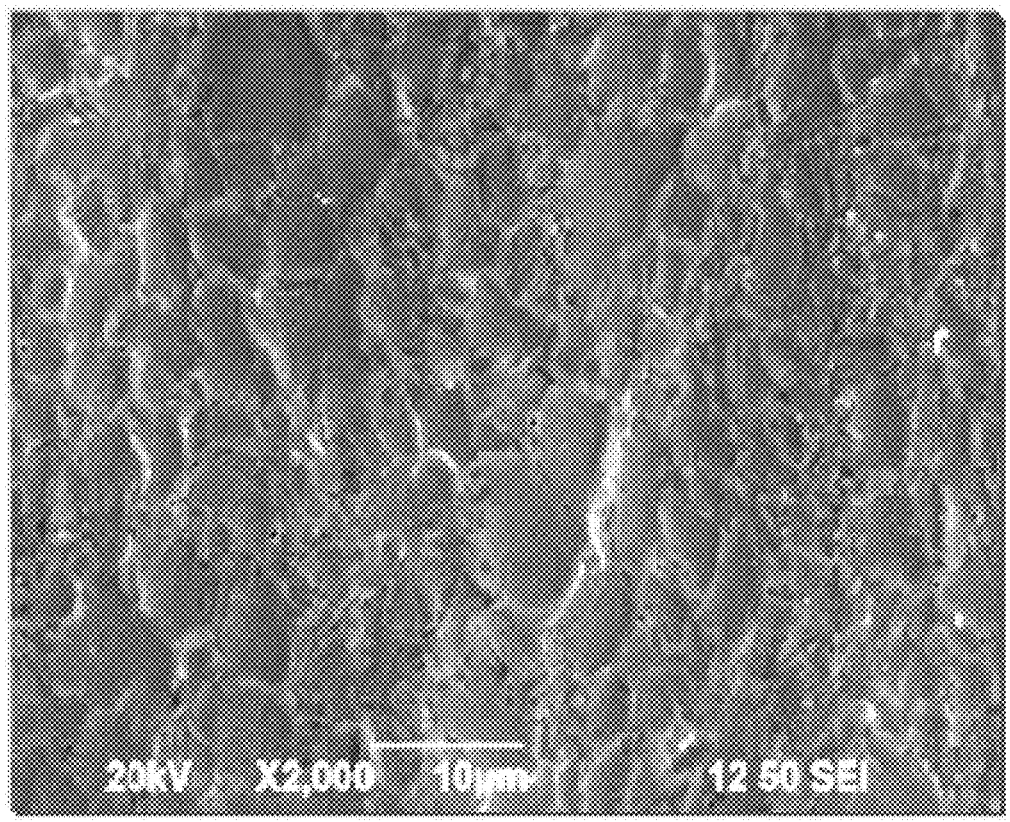
FIG. 3 is an SEM image illustrating a surface microstructure of a tantalum carbide coated carbon material of Comparative Example 2 according to an example embodiment.

Surface microstructures TaC prepared in Examples and Comparative Examples were observed by SEM, and the results were shown in Tables 1 and FIGS. 1 to 3. In Table 1, A composition ratio of Ta and C was data measured by EDS, and based on atomic % (model name: Oxford INCA x-act).

TABLE 1

| Classification | Com. Example 1 | Com. Example 2 | Example 1 | Example 3 |
|---|---|---|---|---|
| C (at %) | 37.57 | 59.48 | 42.68 | 52.68 |
| Ta (at %) | 62.43 | 40.52 | 57.32 | 47.32 |
| Ta/C | 1.66 | 0.68 | 1.34 | 0.90 |
| Surface shape of TaC particle | Wrinkled | Little Wrinkled | Smooth | Smooth |

Referring to Table 1, when observing a TaC surface microstructure according to a ratio of Ta/C, it could be confirmed that Examples 1 and 3 had a smooth shape of the particle surface. This may be additionally confirmed in an SEM image of Example 1 illustrated in FIG. 1.

Like Comparative Examples 1 and 2, under a condition in which the ratio of Ta/C was 1.4 or more and 0.8 or less, wrinkled TaC particle surfaces were formed, and additionally confirmed in FIGS. 2 and 3. That is, these wrinkled TaC particle surfaces tend to increase surface energy by a high surface area, and in the following Table 2, Examples 1 and 3 having the smooth surface at a contact angle exhibit a higher contact angle than Comparative Examples 1 and 2.

(2) XRD Analysis

Figure 5:
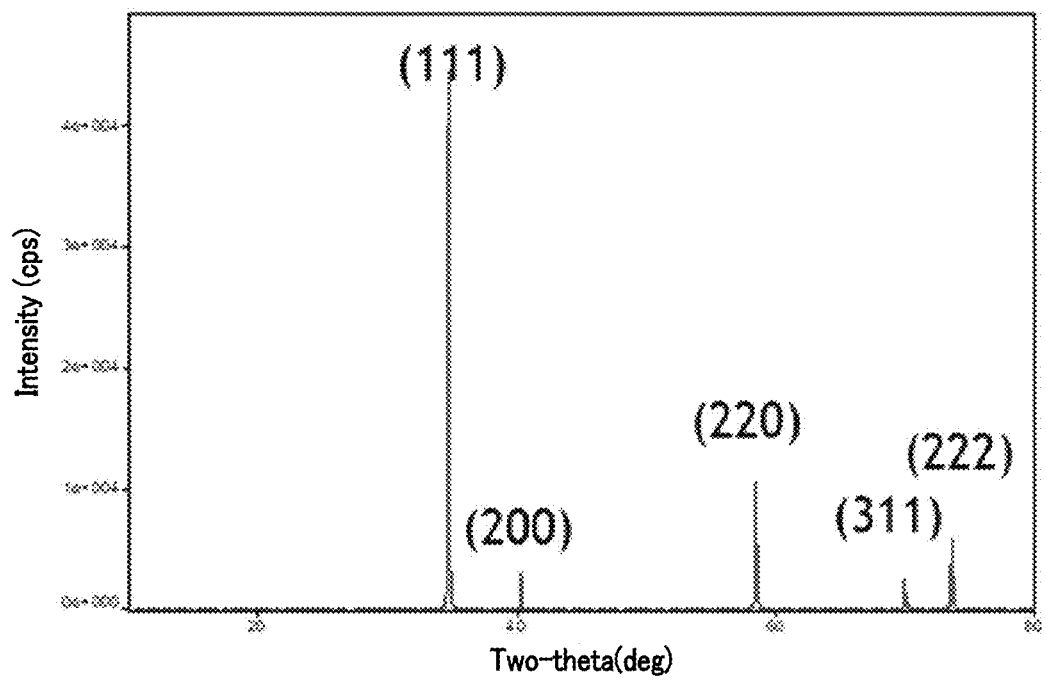
FIG. 5 is an XRD graph illustrating a tantalum carbide coated carbon material of Example 2 according to an example embodiment.
Figure 6:
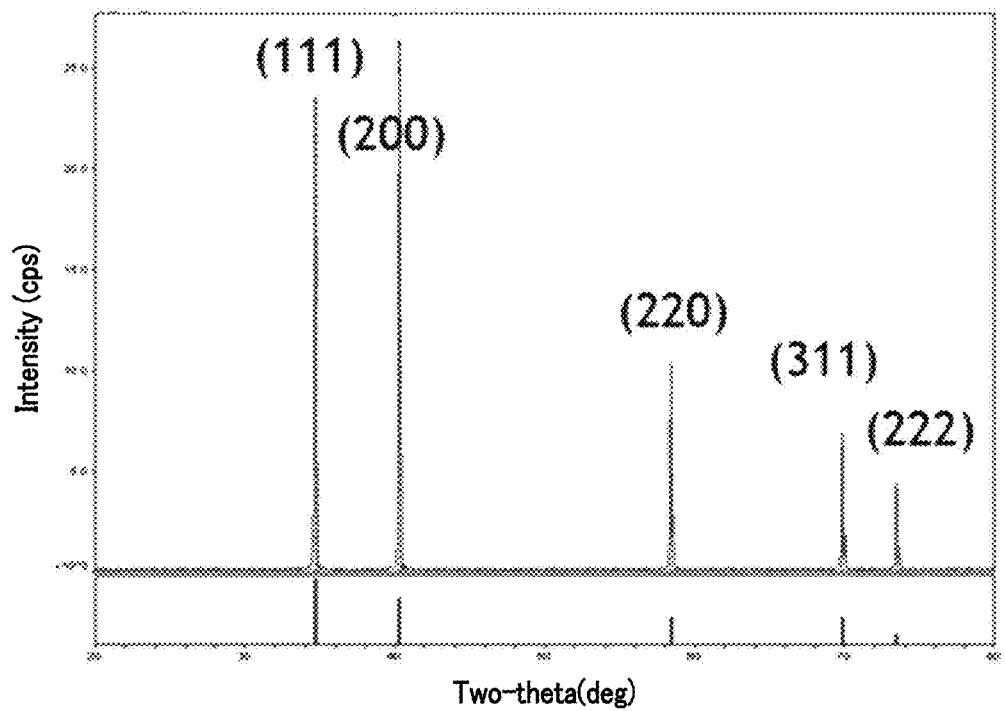
FIG. 6 is an XRD graph illustrating a tantalum carbide coated carbon material of Comparative Example 3 according to an example embodiment.
Figure 7:
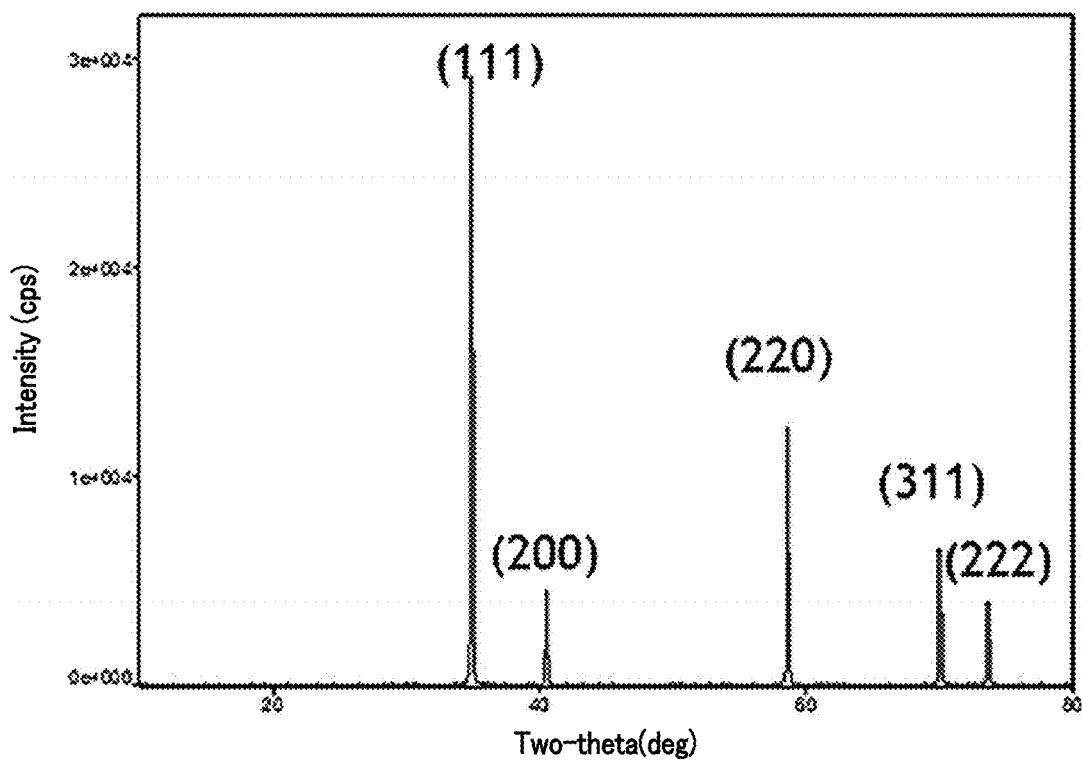
FIG. 7 is an XRD graph illustrating a tantalum carbide coated carbon material of Comparative Example 4 according to an example embodiment.

The XRD of TaC prepared in Example and Comparative Example was measured and illustrated in FIGS. 5 to 7, and in the XRD graph, an intensity ratio of a priority growth peak and a main growth peak according to Equation 1 was calculated and illustrated in Table 2. The analysis for a growth direction measured a peak intensity of each direction using XRD equipment (manufacturer: Rigaku/model name: Ultima IV) and the measurement conditions were a measuring angle of 10° to 80°, a scan speed 10, a scan width of 0.2, and a measuring power of 40 kV and 40 mA.

(3) Analysis of Contact Angle

Figure 4A:
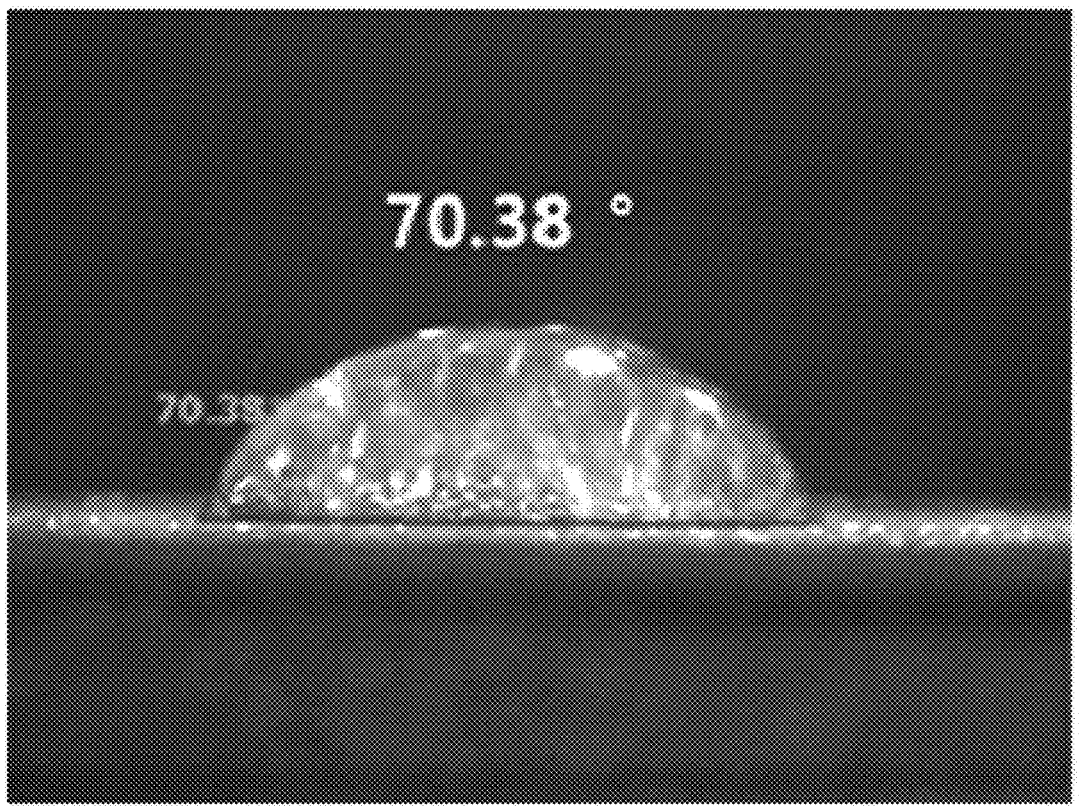
FIG. 4A illustrates the tantalum carbide coated carbon material of Example 1 and FIG. 4B illustrates the tantalum carbide coated carbon material of Comparative Example 1.
Figure 4B:
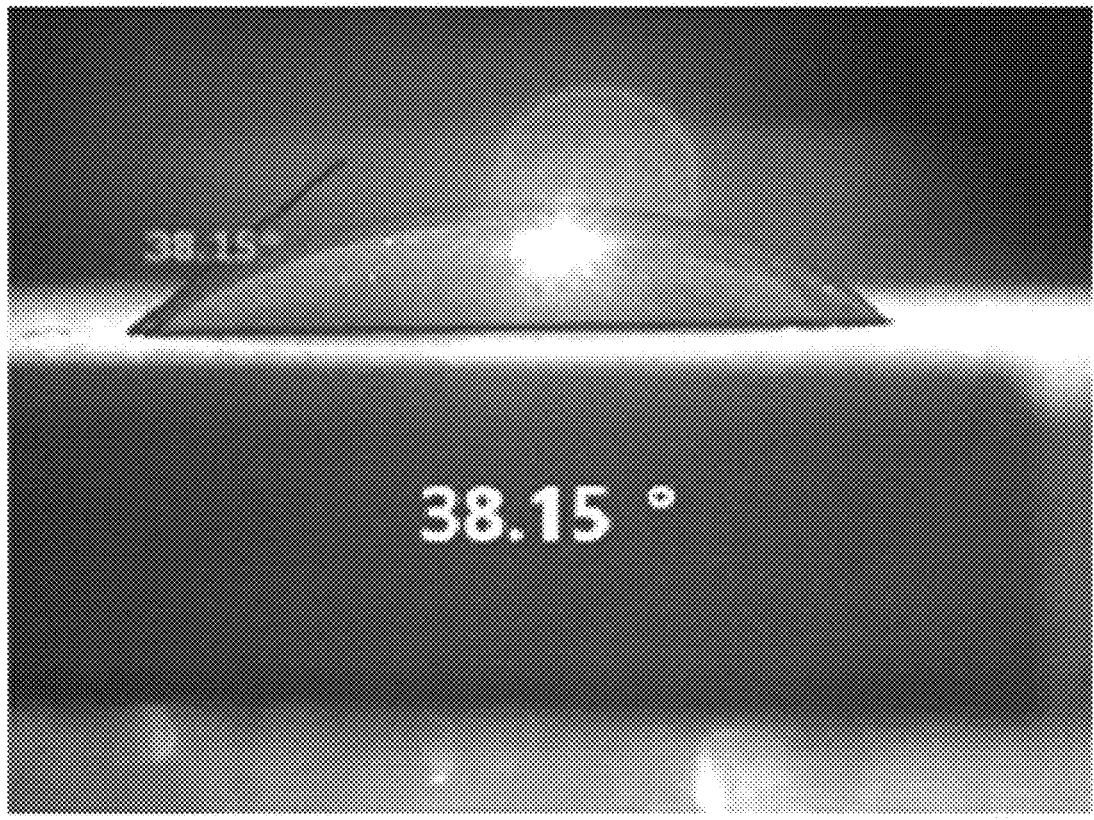

A droplet contact angle was measured using a contact angle measuring device (manufacturer: Dataphysics Instruments/model name: OCA20) and the presence or absence of adsorption of foreign materials on the surface of TaC to was determined and illustrated in Table 2 and FIG. 4.

TABLE 2

| Classification | Ta/C ratio | X-ray diffraction (Main Peak) | XRD Peak ratio (111)/((200) + (220) + (311) + (222)) | Contact angle (unit: °) | Adsorption of foreign material on target region |
|---|---|---|---|---|---|
| Com. Example 1 | 1.66 | (220) | 0.12 | 36.26 | Presence |
| Com. Example 2 | 0.68 | (220) | 0.52 | 37.45 | Presence |
| Com. Example 3 | 0.68 | (200) | 0.49 | 38.15 | Presence |
| Com. Example 4 | 1.44 | (111) | 1.04 | 44.97 | Presence |
| Example 1 | 1.34 | (111) | 2.31 | 70.38 | Absence |
| Example 2 | 1.20 | (111) | 2.05 | 75.46 | Absence |
| Example 3 | 0.90 | (111) | 1.80 | 65.84 | Absence |

In Table 2, changes in contact angle according to a Ta/C ratio and a crystal direction may be confirmed, and it may be confirmed that when it is satisfied that both priority growth is performed in a (111)-plane crystal direction and an XRD peak ratio of (111)/((200)+(220)+(311)+(222)) is 1.8 or more, the contact angle is greatly increased. Furthermore, it may be confirmed that the foreign materials are almost not adsorbed in the target region when measuring the temperature by the thermometer in the semiconductor process.

As described above, although the example embodiments have been described by the restricted example embodiments and the drawings, various modifications and variations may be made from the above description by those skilled in the art. For example, even if the described techniques are performed in a different order from the described method, and/or components such as a system, a structure, a device, a circuit, etc. described above are coupled or combined in a different form from the described method, or replaced or substituted by other components or equivalents, an appropriate result may be achieved. Therefore, other implementations, other example embodiments, and equivalents to the appended claims fall within the scope of the claims to be described below.

What is claimed is:

1. A tantalum carbide coated carbon material comprising:
   a substrate; and
   a tantalum carbide film formed on the substrate, wherein a surface contact angle of the tantalum carbide film is 50° or more,
wherein the tantalum carbide film has a thickness of 10 μm to 50 μm,
wherein the tantalum carbide film includes X-ray diffraction peaks of (111), (200), (220), (311) and (222) planes as a main peak and a diffraction intensity ratio according to the following relation 1 is 1.8 to 2.5, $$I(111)/I(200)+(220)+(311)+(222)) \quad \text{[Equation 1]}.$$

2. The tantalum carbide coated carbon material of claim 1, wherein a surface contact angle of the tantalum carbide film is 65° to 76°.

3. The tantalum carbide coated carbon material of claim 1, wherein the tantalum carbide film is (111)-plane priority growth in X-ray diffraction analysis.

4. The tantalum carbide coated carbon material of claim 1, wherein an atomic ratio of Ta to C in the tantalum carbide film is 0.9 to 1.34.

5. The tantalum carbide coated carbon material of claim 1, wherein the tantalum carbide film is formed by CVD.

6. The tantalum carbide coated carbon material of claim 1, wherein the tantalum carbide film includes 30 or less of wrinkled patterns per unit area ($mm^2$) of a surface of a crystal grain.

7. The tantalum carbide coated carbon material of claim 1, wherein a ratio of the thickness of the tantalum carbide film formed on one surface of the substrate to the thickness of the substrate is 2000:1 or 100:1.

8. The tantalum carbide coated carbon material of claim 1, wherein the substrate includes graphite.

9. The tantalum carbide coated carbon material of claim 1, wherein the tantalum carbide coated carbon material is a component of a device used for single crystal SiC/AlN epitaxy and SiC/AlN growth process equipment.

* * * * *